(12) United States Patent
Negley et al.

(10) Patent No.: US 8,596,819 B2
(45) Date of Patent: Dec. 3, 2013

(54) LIGHTING DEVICE AND METHOD OF LIGHTING

(75) Inventors: Gerald H. Negley, Durham, NC (US); Antony Paul Van De Ven, Hong Kong (HK); Thomas G. Coleman, Pittsboro, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/755,153

(22) Filed: May 30, 2007

(65) Prior Publication Data

US 2007/0279903 A1     Dec. 6, 2007

Related U.S. Application Data

(60) Provisional application No. 60/809,618, filed on May 31, 2006.

(51) Int. Cl.
*F21V 21/00*     (2006.01)

(52) U.S. Cl.
USPC .................. 362/249.02; 362/311.02; 362/800

(58) Field of Classification Search
USPC .......... 362/230, 231, 545, 555, 800; 315/291; 313/503, 467, 468
See application file for complete search history.

(56) References Cited

U.S. PATENT DOCUMENTS

| | | | |
|---|---|---|---|
| 2,001,622 A | 5/1935 | McCaa |
| 2,295,339 A | 9/1942 | Ericson |
| 2,907,870 A | 10/1959 | Calmes |
| 3,684,930 A | 8/1972 | Collins et al. |
| 3,760,237 A | 9/1973 | Jaffe |
| 3,805,347 A | 4/1974 | Collins et al. |
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,703,219 A | 10/1987 | Mesquida |
| 4,710,699 A | 12/1987 | Miyamoto |

(Continued)

FOREIGN PATENT DOCUMENTS

| | | |
|---|---|---|
| DE | 3916875 | 12/1990 |
| DE | 10-335077 | 3/2005 |

(Continued)

OTHER PUBLICATIONS

U.S. Appl. No. 11/613,692, filed Dec. 20, 2006.

(Continued)

*Primary Examiner* — Stephen F Husar
*Assistant Examiner* — Meghan Dunwiddie
(74) *Attorney, Agent, or Firm* — Burr & Brown

(57) ABSTRACT

There is provided a lighting device which emits light with an efficacy of at least 60 lumens per watt. The lighting device comprises at least one solid state light emitter, e.g., one or more light emitting diodes, and optionally further includes one or more lumiphor. In some embodiments, the output light is of a brightness of at least 300 lumens. In some embodiments, the output light has a CRI Ra of at least 90. Also, a method of lighting, comprising supplying electricity to a lighting device which emits light with an efficacy of at least 60 lumens per watt.

67 Claims, 8 Drawing Sheets

(56) References Cited

U.S. PATENT DOCUMENTS

| | | |
|---|---|---|
| 4,902,356 A | 2/1990 | Noguchi et al. |
| 4,912,532 A | 3/1990 | Cook et al. |
| 5,087,883 A | 2/1992 | Hoffman |
| 5,103,271 A | 4/1992 | Izumiya et al. |
| 5,111,606 A | 5/1992 | Reynolds |
| 5,264,997 A | 11/1993 | Hutchisson et al. |
| 5,376,580 A | 12/1994 | Kish et al. |
| 5,407,799 A | 4/1995 | Studier |
| 5,410,519 A | 4/1995 | Hall et al. |
| 5,416,342 A | 5/1995 | Edmond et al. |
| 5,477,436 A | 12/1995 | Betling et al. |
| 5,502,316 A | 3/1996 | Kish et al. |
| 5,563,849 A | 10/1996 | Hall et al. |
| 5,739,554 A | 4/1998 | Edmond et al. |
| 5,803,579 A | 9/1998 | Turnbull et al. |
| 5,838,706 A | 11/1998 | Edmond et al. |
| 5,851,063 A | 12/1998 | Doughty et al. |
| 5,890,794 A | 4/1999 | Abtahi et al. |
| 5,912,477 A | 6/1999 | Negley |
| 5,959,316 A | 9/1999 | Lowery |
| 5,985,687 A | 11/1999 | Bowers et al. |
| 6,066,861 A | 5/2000 | Hohn et al. |
| 6,071,795 A | 6/2000 | Cheung et al. |
| 6,076,936 A | 6/2000 | George |
| 6,084,250 A | 7/2000 | Justel et al. |
| 6,095,666 A | 8/2000 | Salam |
| 6,100,104 A | 8/2000 | Haerle et al. |
| 6,120,600 A | 9/2000 | Edmond et al. |
| 6,132,072 A | 10/2000 | Turnbull et al. |
| 6,187,606 B1 | 2/2001 | Edmond et al. |
| 6,201,262 B1 | 3/2001 | Edmond et al. |
| 6,212,213 B1 | 4/2001 | Weber et al. |
| 6,234,645 B1 | 5/2001 | Borner et al. |
| 6,234,648 B1 | 5/2001 | Borner et al. |
| 6,244,728 B1 | 6/2001 | Cote et al. |
| 6,252,254 B1 * | 6/2001 | Soules et al. ............... 257/89 |
| 6,255,670 B1 | 7/2001 | Srivastava et al. |
| 6,258,699 B1 | 7/2001 | Chang et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,303,405 B1 | 10/2001 | Yoshida et al. |
| 6,319,425 B1 | 11/2001 | Tasaki et al. |
| 6,335,263 B1 | 1/2002 | Cheung et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,365,429 B1 | 4/2002 | Kneissl et al. |
| 6,373,077 B1 | 4/2002 | Edmond et al. |
| 6,394,621 B1 | 5/2002 | Hanewinkel |
| 6,403,985 B1 | 6/2002 | Fan et al. |
| 6,410,940 B1 | 6/2002 | Jiang et al. |
| 6,410,942 B1 | 6/2002 | Thibeault et al. |
| 6,420,199 B1 | 7/2002 | Coman et al. |
| 6,420,242 B1 | 7/2002 | Cheung et al. |
| 6,429,583 B1 * | 8/2002 | Levinson et al. ............ 313/503 |
| 6,441,558 B1 | 8/2002 | Muthu |
| 6,448,102 B1 | 9/2002 | Kneissl et al. |
| 6,459,100 B1 | 10/2002 | Doverspike et al. |
| 6,465,809 B1 | 10/2002 | Furukawa et al. |
| 6,468,824 B2 | 10/2002 | Chen et al. |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,513,949 B1 | 2/2003 | Marshall et al. |
| 6,522,063 B2 | 2/2003 | Chen et al. |
| 6,522,065 B1 * | 2/2003 | Srivastava et al. ........... 313/503 |
| 6,538,371 B1 | 3/2003 | Duggal et al. |
| 6,550,949 B1 | 4/2003 | Bauer et al. |
| 6,552,495 B1 | 4/2003 | Chang |
| 6,559,075 B1 | 5/2003 | Kelly et al. |
| 6,562,648 B1 | 5/2003 | Wong et al. |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Meuller-Mach et al. |
| 6,607,931 B2 | 8/2003 | Streubel |
| 6,608,485 B2 | 8/2003 | St-Germain |
| 6,610,551 B1 | 8/2003 | Doverspike et al. |
| 6,616,862 B2 | 9/2003 | Srivastava et al. |
| 6,624,350 B2 | 9/2003 | Nixon et al. |
| 6,635,503 B2 | 10/2003 | Andrews et al. |
| 6,636,003 B2 | 10/2003 | Rahm et al. |
| 6,642,072 B2 | 11/2003 | Inoue et al. |
| 6,642,666 B1 | 11/2003 | St-Germain |
| 6,649,437 B1 | 11/2003 | Yang et al. |
| 6,657,236 B1 | 12/2003 | Thibeault et al. |
| 6,664,560 B2 | 12/2003 | Emerson et al. |
| 6,677,173 B2 | 1/2004 | Ota |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,716,654 B2 | 4/2004 | Hsu et al. |
| 6,734,033 B2 | 5/2004 | Emerson et al. |
| 6,737,801 B2 | 5/2004 | Ragle |
| 6,740,604 B2 | 5/2004 | Kelly et al. |
| 6,740,906 B2 | 5/2004 | Slater, Jr. et al. |
| 6,744,194 B2 | 6/2004 | Fukasawa et al. |
| 6,747,298 B2 | 6/2004 | Slater, Jr. et al. |
| 6,757,314 B2 | 6/2004 | Kneissl et al. |
| 6,762,563 B2 | 7/2004 | St-Germain |
| 6,784,463 B2 | 8/2004 | Camras et al. |
| 6,786,390 B2 | 9/2004 | Yang et al. |
| 6,791,119 B2 | 9/2004 | Slater, Jr. et al. |
| 6,791,257 B1 | 9/2004 | Sato et al. |
| 6,791,259 B1 | 9/2004 | Stokes et al. |
| 6,800,500 B2 | 10/2004 | Coman et al. |
| 6,800,876 B2 | 10/2004 | Edmond et al. |
| 6,806,112 B1 | 10/2004 | Horng et al. |
| 6,809,341 B2 | 10/2004 | Hsu et al. |
| 6,815,312 B2 | 11/2004 | Furukawa et al. |
| 6,817,735 B2 | 11/2004 | Shimizu et al. |
| 6,821,804 B2 | 11/2004 | Thibeault et al. |
| 6,825,501 B2 | 11/2004 | Edmond et al. |
| 6,841,804 B1 | 1/2005 | Chen et al. |
| 6,846,686 B2 | 1/2005 | Saeki et al. |
| 6,849,878 B2 | 2/2005 | Bader et al. |
| 6,851,834 B2 | 2/2005 | Leysath |
| 6,880,954 B2 | 4/2005 | Ollett et al. |
| 6,882,101 B2 | 4/2005 | Ragle |
| 6,914,267 B2 | 7/2005 | Fukasawa et al. |
| 6,936,857 B2 | 8/2005 | Doxsee et al. |
| 6,967,116 B2 | 11/2005 | Negley |
| 7,005,679 B2 | 2/2006 | Tarsa et al. |
| 7,008,078 B2 | 3/2006 | Shimizu et al. |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta |
| 7,102,172 B2 | 9/2006 | Lynch et al. |
| 7,125,143 B2 | 10/2006 | Hacker |
| 7,135,664 B2 | 11/2006 | Vornsand et al. |
| 7,144,121 B2 | 12/2006 | Minano et al. |
| 7,164,231 B2 | 1/2007 | Choi et al. |
| 7,207,691 B2 | 4/2007 | Lee et al. |
| 7,213,940 B1 * | 5/2007 | Van De Ven et al. ......... 362/231 |
| 7,215,074 B2 | 5/2007 | Shimizu et al. |
| 7,232,212 B2 | 6/2007 | Iwase |
| 7,239,085 B2 | 7/2007 | Kawamura |
| 7,250,635 B2 | 7/2007 | Lee et al. |
| 7,250,715 B2 | 7/2007 | Mueller et al. |
| 7,255,457 B2 | 8/2007 | Ducharme et al. |
| 7,256,557 B2 | 8/2007 | Lim et al. |
| 7,329,024 B2 | 2/2008 | Lynch et al. |

(56) References Cited

U.S. PATENT DOCUMENTS

| | | | |
|---|---|---|---|
| 7,350,955 B2 | 4/2008 | Chang et al. |
| 7,354,180 B2 | 4/2008 | Sawhney et al. |
| 7,358,954 B2 | 4/2008 | Negley |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,474,044 B2 | 1/2009 | Ge |
| 2001/0002049 A1 | 5/2001 | Reeh et al. |
| 2002/0006350 A1 | 1/2002 | Nishida et al. |
| 2002/0022290 A1 | 2/2002 | Kong et al. |
| 2002/0028527 A1 | 3/2002 | Maeda et al. |
| 2002/0068373 A1 | 6/2002 | Lo et al. |
| 2002/0070681 A1 | 6/2002 | Shimizu et al. |
| 2002/0087532 A1 | 7/2002 | Barritz et al. |
| 2002/0121642 A1 | 9/2002 | Doverspike et al. |
| 2002/0197764 A1 | 12/2002 | Uemura et al. |
| 2003/0015721 A1 | 1/2003 | Slater et al. |
| 2003/0020084 A1 | 1/2003 | Fan et al. |
| 2003/0026096 A1 | 2/2003 | Ellens et al. |
| 2003/0030063 A1 | 2/2003 | Sosniak et al. |
| 2003/0045015 A1 | 3/2003 | Slater, Jr. et al. |
| 2003/0067265 A1 | 4/2003 | Srivastava et al. |
| 2003/0067773 A1 | 4/2003 | Marshall et al. |
| 2003/0117798 A1 | 6/2003 | Leysath |
| 2003/0132701 A1 | 7/2003 | Sato et al. |
| 2003/0146411 A1 | 8/2003 | Srivastava et al. |
| 2003/0173602 A1 | 9/2003 | Hsu et al. |
| 2003/0197170 A1 | 10/2003 | Bader et al. |
| 2003/0222268 A1 | 12/2003 | Yocom et al. |
| 2004/0004226 A1 | 1/2004 | Eisert et al. |
| 2004/0012027 A1 | 1/2004 | Keller et al. |
| 2004/0026683 A1 | 2/2004 | Yamada et al. |
| 2004/0033638 A1 | 2/2004 | Bader et al. |
| 2004/0046178 A1 | 3/2004 | Sano |
| 2004/0072382 A1 | 4/2004 | Kelly et al. |
| 2004/0090794 A1 | 5/2004 | Ollett et al. |
| 2004/0105261 A1 | 6/2004 | Ducharme et al. |
| 2004/0105264 A1* | 6/2004 | Spero ........................... 362/276 |
| 2004/0124429 A1 | 7/2004 | Stokes et al. |
| 2004/0135158 A1 | 7/2004 | Hon |
| 2004/0165379 A1 | 8/2004 | Waters |
| 2004/0212998 A1 | 10/2004 | Mohacsi |
| 2004/0218387 A1 | 11/2004 | Gerlach |
| 2004/0264193 A1 | 12/2004 | Okumura |
| 2005/0006669 A1 | 1/2005 | Mishra et al. |
| 2005/0052378 A1 | 3/2005 | Hacker |
| 2005/0099478 A1 | 5/2005 | Iwase |
| 2005/0111234 A1 | 5/2005 | Martin et al. |
| 2005/0237733 A1 | 10/2005 | Laski et al. |
| 2005/0237739 A1 | 10/2005 | Lee et al. |
| 2005/0243556 A1 | 11/2005 | Lynch |
| 2005/0251698 A1 | 11/2005 | Lynch et al. |
| 2005/0259423 A1 | 11/2005 | Heuser |
| 2005/0274972 A1 | 12/2005 | Roth et al. |
| 2005/0278998 A1 | 12/2005 | Sawhney et al. |
| 2006/0012299 A1 | 1/2006 | Suehiro et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0158089 A1 | 7/2006 | Saito et al. |
| 2006/0180818 A1 | 8/2006 | Nagai |
| 2006/0181192 A1 | 8/2006 | Radkov |
| 2006/0245184 A1 | 11/2006 | Galli |
| 2007/0001188 A1 | 1/2007 | Lee |
| 2007/0041220 A1 | 2/2007 | Lynch |
| 2007/0051966 A1 | 3/2007 | Higashi |
| 2007/0090381 A1 | 4/2007 | Otsuka et al. |
| 2007/0115671 A1* | 5/2007 | Roberts et al. ................ 362/367 |
| 2007/0137074 A1 | 6/2007 | Van De Ven et al. |
| 2007/0139920 A1 | 6/2007 | Van De Ven et al. |
| 2007/0139923 A1 | 6/2007 | Negley et al. |
| 2007/0170447 A1 | 7/2007 | Negley |
| 2007/0171145 A1 | 7/2007 | Coleman et al. |
| 2007/0202623 A1 | 8/2007 | Gao |
| 2007/0223219 A1 | 9/2007 | Medendorp et al. |
| 2007/0236911 A1 | 10/2007 | Negley |
| 2007/0247414 A1 | 10/2007 | Roberts |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279903 A1 | 12/2007 | Negley |
| 2007/0280624 A1 | 12/2007 | Negley et al. |
| 2008/0084685 A1 | 4/2008 | Van De Ven |
| 2008/0084701 A1 | 4/2008 | Negley |
| 2008/0088248 A1 | 4/2008 | Myers |
| 2008/0089053 A1 | 4/2008 | Negley |
| 2008/0106895 A1 | 5/2008 | Van De Ven |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Negley |
| 2008/0137347 A1 | 6/2008 | Trott et al. |
| 2008/0170396 A1 | 7/2008 | Yuan et al. |
| 2008/0179602 A1 | 7/2008 | Negley |
| 2008/0192462 A1 | 8/2008 | Steedly et al. |
| 2008/0192493 A1 | 8/2008 | Villard |
| 2008/0211416 A1 | 9/2008 | Negley et al. |
| 2008/0231201 A1 | 9/2008 | Higley et al. |
| 2008/0259589 A1 | 10/2008 | Van De Ven et al. |
| 2008/0278928 A1 | 11/2008 | Van De Ven et al. |
| 2008/0278940 A1 | 11/2008 | Van De Ven et al. |
| 2008/0278950 A1 | 11/2008 | Pickard et al. |
| 2008/0278952 A1 | 11/2008 | Trott et al. |
| 2008/0304260 A1 | 12/2008 | Van De Ven et al. |
| 2008/0304261 A1 | 12/2008 | Van De Ven et al. |
| 2008/0304269 A1 | 12/2008 | Pickard et al. |
| 2008/0309255 A1 | 12/2008 | Myers |
| 2008/0310154 A1 | 12/2008 | Van De Ven et al. |
| 2009/0002986 A1 | 1/2009 | Medendorp et al. |
| 2009/0009045 A1 | 1/2009 | Schug et al. |
| 2011/0013396 A1 | 1/2011 | Schug et al. |

FOREIGN PATENT DOCUMENTS

| | | |
|---|---|---|
| EP | 0 838 866 | 4/1998 |
| EP | 0 936 682 A1 | 8/1999 |
| EP | 0 971 421 | 1/2000 |
| EP | 1 024 399 | 8/2000 |
| EP | 1 081 771 | 3/2001 |
| EP | 1 111 966 | 6/2001 |
| EP | 1 160 883 | 12/2001 |
| EP | 1 193 772 | 4/2002 |
| EP | 1 263 058 | 12/2002 |
| EP | 1 367 655 | 12/2003 |
| EP | 1 462 711 | 12/2004 |
| EP | 1 566 848 | 8/2005 |
| EP | 1 571 715 | 9/2005 |
| EP | 1 760 795 | 1/2006 |
| JP | 61-059886 | 3/1986 |
| JP | 10-163535 | 6/1998 |
| JP | 11-238913 | 8/1999 |
| JP | 2000-022222 | 1/2000 |
| JP | 2000-183408 | 6/2000 |
| JP | 2001-111114 | 4/2001 |
| JP | 2001-156331 | 6/2001 |
| JP | 2001-307506 | 11/2001 |
| JP | 2002-076446 | 3/2002 |

(56) References Cited

FOREIGN PATENT DOCUMENTS

| | | |
|---|---|---|
| JP | 2002-76446 | 3/2002 |
| JP | 2002-150821 | 5/2002 |
| JP | 2002-531955 | 9/2002 |
| JP | 2003-515956 | 5/2003 |
| JP | 2004-080046 | 3/2004 |
| JP | 2004-103443 | 4/2004 |
| JP | 2004-128444 | 4/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-142311 | 6/2005 |
| JP | 2005-158746 | 6/2005 |
| JP | 2006-083219 | 3/2006 |
| JP | 2007-122950 | 5/2007 |
| JP | 2007-141737 | 6/2007 |
| TW | 546854 | 8/2003 |
| WO | 98/43014 | 10/1998 |
| WO | 00/33389 | 6/2000 |
| WO | 00/34709 | 6/2000 |
| WO | 01/41215 | 6/2001 |
| WO | 01/69692 | 9/2001 |
| WO | 2004/068909 | 8/2004 |
| WO | 2005/004202 | 1/2005 |
| WO | 2005/013365 | 10/2005 |
| WO | 2005/124877 | 12/2005 |
| WO | 2006/016325 | 2/2006 |
| WO | 2006/028312 | 3/2006 |
| WO | 2007/061758 | 5/2007 |

OTHER PUBLICATIONS

U.S. Appl. No. 11/614,180, filed Dec. 21, 2006.
U.S. Appl. No. 11/613,714, filed Dec. 20, 2006.
U.S. Appl. No. 11/613,733, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/737,321, filed Apr. 19, 2007.
U.S. Appl. No. 11/755,149, filed May 30, 2007.
U.S. Appl. No. 11/755,162, filed May 30, 2007.
U.S. Appl. No. 11/856,421, filed Sep. 17, 2007.
U.S. Appl. No. 11/859,048, filed Sep. 21, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/035,604, filed Feb. 22, 2008.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/117,148, filed May 8, 2008.
U.S. Appl. No. 12/117,271, filed May 8, 2008.
U.S. Appl. No. 12/277,745, filed Nov. 25, 2008.
U.S. Appl. No. 12/057,748, filed Mar. 28, 2008.
U.S. Appl. No. 11/743,324, filed May 2, 2007.
U.S. Appl. No. 11/689,614, filed Mar. 22, 2007.
U.S. Appl. No. 11/112,429, filed Apr. 22, 2005.
U.S. Appl. No. 11/227,667, filed Sep. 15, 2005.
U.S. Appl. No. 12/248,220, filed Oct. 9, 2008.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Shimizu, "Development of High-Efficiency LED Downlight", First International Conference on White LEDs and Solid State Lighting.
Press Release from LED Lighting Fixtures dated Nov. 28, 2007 entitled "New Lamp from LED Lighting Fixtures Shatters World Record for Energy Efficiency".
CSA International, "Test Data Report", Project No. 1786317, Report No. 1786317-1 (Apr. 2006).
Compound Semiconductors Online, "LED Lighting Fixtures, Inc. Sets World Record at 80 Lumens per Watt for Warm White".
U.S. Department of Energy, "DOE Solid-State Lighting CALiPER Program, Summary of Results: Round 3 of Product Testing", Oct. 2007.
U.S. Department of Energy, "DOE Solid-State Lighting CALiPER Program, Summary of Results: Round 4 of Product Testing", Jan. 2008.
U.S. Department of Energy, "DOE Solid-State Lighting CALiPER Program, Summary of Results: Round 5 of Product Testing", May 2008.
Windisch, R., et al., "40% Efficient Thin-Film Surface-Textured Light-Emitting Diodes by Optimization of Natural Lithography," IEEE Transactions on Electron Devices, ISSN: 0018-9383, vol. 47 No. 7, Jul. 2000, pp. 1492-1498.
Compound Semiconductors Online, "LED Lighting Fixtures, Inc. Sets World Record at 80 Lumens per Watt for Warm White", Compound Semiconductors Online, May 30, 2006, pp. 1.
CSA International, "Test Data Report," Project No. 1786317, Report No. 1786317-1 (Apr. 2006).
DOE SSK CALiPer Report, "Product Test Reference: CALiPER 07-31 Downlight Lamp", (Sep. 2007).
DOE SSL CALiPer Report, "Product Test Reference: CALiPER 07-47 Downlight Lamp" (Sep. 2007).
Narendran et al., "Solid State lighting: failure analysis of white LEDs," Journal of Cystal Growth, vol. 268, Issues 1-4, Aug. 2004, Abstract.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".
Press Release from LED Lighting Fixtures dated Feb. 7, 2007 entitled "LED Lighting Fixtures Announces its first LED-based Recessed Down Light".
Press Release from LED Lighting Fixtures dated Jan. 26, 2006 entitled "LED Lighting Fixtures Creates 750 Lumen Recessed Light and Uses Only 16 Watts of Power".
Press Release from LED Lighting Fixtures dated May 30, 2006 entitled "LED Lighting Fixtures, Inc. Sets World Record at 80 Lumens per Watt for Warm White Fixture".
Press Release from LED Lighting Fixtures dated May 4, 2007 entitled "LED Lighting Fixtures to Expand Product Line".
Press Release from LED Lighting Fixtures dated Nov. 28, 2007 entitled "New Lamp from LED Lighting Fixtures Shatter World Record for Energy Efficiency".
Shimizu, "Development of High-Efficiency LED Downlight", First International Conference on White LEDs and Solid State Lighting, Nov. 30, 2007.
U.S. Department of Energy, "DOE Solid-State Lighting CALiPER Program, Summary of Results: Round 3 of Product Testing," Oct. 2007.
U.S. Department of Energy, "DOE Solid-State Lighting CALiPER Program, Summary of Results: Round 4 of Product Testing," Jan. 2008.
U.S. Department of Energy, "DOE Solid-State Lighting CALiPER Program, Summary of Results: Round 5 of Product Testing," May 2008.
Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
Chhajed, S., *Influence of junction temperature on chromaticity and color-rendering properties of trichromatic white-light sources. . .* , Journal of Applied Physics, 2005, vol. 97pp. 1-8.

(56) References Cited

OTHER PUBLICATIONS

Color Kinetics Inc., *Color Quality of Intelligent Solid-State Light Systems*, Color Quality of Solid-State Light Sources, Mar. 2005, pp. 1-3.
Compound Semiconductors Online, "LED Lighting Fixtures, Inc. Sets World Record at 80 Lumens per Wait for Warm White", Compound Semiconductors Online, May 30, 2006, pp. 1.
Cree, Inc., "Cree® Xlamp® 7090 XR-E Series LED Binning and Labeling," Application Note: CLD-AP08.000, 7pp (2006).
DOE SSL CALiPer Report, "Product Test Reference: CALiPER 07-31 Downlight Lamp".
DOE SSL CALiPer Report, "Product Test Reference: CALiPER 07-47 Downlight Lamp".
Krames et al., *Lumileds Lighting, Light from Silicon Valley*, Progress and Future Direction of LED Technology, SSL Workshop, Nov. 13, 2003, Publisher: Limileds Lighting Inc., pp. 1-21.
Narendran et al., *Color Rendering Properties of LED Light Sources*, 2002, pp. 1-8.
Nichia, White Light LED, Part Nos. NSPW300BS and NSPW312BS, High Brightness LEDs, Nov. 12, 1999, Publisher: Nichia Corporation.
OptoLED Lighting Inc., *OptoLED Product Information*, 2009, Publisher: OptoLED GmBH website: accessed at http://222.optoled.de/englisch/products/led.html.
Bullman, G.E., et al., "Nitride Lasers on SiC Substrates," Laser and Electro-Optics Annual Meeting, ISBN 0-7803-4947-4, IEEE, Dec. 1, 1998, vol. 2, pp. 348-349.
Craford, M. George, "Visible LEDs: The Trend Toward High Power Emitters and rRmaining Challenges for Solid State Lighting, Solid State Lighting II," Proc. of SPIE, vol. 4776, 2002.
Epitech Technology Corporation, Near Blue LED Chip, Dec. 2003.
Epitech Technology Corporation, Traffic Green LED Chip, Dec. 2003.
Gardner et al., "High-Flux and High Efficiency Nitride-Based Light Emitting Diodes," IEEE 2002, pp. 641-642.
Harle et al., "Advanced Technologies for High Efficiency GaInN LEDs for Solid State Lighting," Third International Conference on Solid State Lighting, Proc. of SPIE, vol. 5187, 2004.
Instrument Systems, LED Station, MAS 40 Turn-key System for LED Testing.
Koike et al., "Development of High Efficiency GaN-based Multiquantum-Well Light Emitting Diodes and their Applications," IEEE, vol. 8, No. 2, Mar.-Apr. 2002.
Kuo et al., "Nitride-based Near-Ultraviolet LEDs with an ITO Transparent Contact," Materials Science and Engineering, vol. B106, 2004, pp. 69-72.
Labsphere, The Radiometry of Light Emitting Diodes—Technical Guide.
Morita et al., "Over 200 mW on 365 nm Ultraviolet Light Emitting Diode of GaN-free Structure," Phys. Stat. Sol., vol. 200, No. 1, 2003, pp. 114-117.
Mukai et al., "GaN-based Light-Emitting Diodes Suitable for White Light, Light Emitting Diodes: Research, Manufacturing, and Applicatons VII," Proc of SPIE, vol. 4996, 2003.
Mukai et al., "Recent Progress of Nitride-Based Light Emitting Devices," Phys. Stat. Sol. vol. 200, No. 1, pp. 52-57, 2003.
Nakamura, S. et al., "Superbright Green Ingan Single-Quantum-Well-Structure Light-Emitting Diodes," Japanese Journal of Applied Physics, ISSN: 0021-4922, vol. 34, No. 10B, Part 2, Oct. 15, 1995, pp. L1332-L1335.
Nichia Corporation, White LED Analysis, Mar. 17, 2004.
Niki et al., "White LEDs for Solid State Lighting," Third International Conference on Solid State Lighting, Proc. of SPIE, vol. 5187, 2004.
Seoul Semiconductor Co., Ltd., AlInGaN LED Device, 2003.
SMT LEDs Ideally Suited for New Generation, Solid-State Lighting Solutions, Mar. 31, 2004, Business Wire.
Tadamoto et al., "High Output Power Near-Ultraviolet and Violet Light-Emitting Diodes Fabricated on Patterned Sapphire Substrates Using Metalorganic Vapor Phase Epitaxy," Third International Conference on Solid State Lighting, Proc. of SPIE, vol. 5187, 2004.
United Epitaxy Company, Ltd., Specifications Confirmation Letter, 4713DC AlInGaN Blue LED Chip, 2003.
Unity Opto Technology Co., Ltd., AlGaAs/GaAs High Power T-1 3/4 Package Infrared Emitting Diode, Nov. 17, 2000.
Windisch, R., et al., "40% Efficient Thin-Film Surface-Textured Light-Emitting Diodes by Optimization of Natural Lithography," IEEE Transactions on Electron Devices, ISSN: 0018-9383, vol. 47 No. 7, Jul. 2000, pp. 1492-1498.
Zukauskas et al., "Optimization of multichip white solid-state lighting source with four or more LEDs," Solid State Lighting and Displays Proceedings of SPIE, vol. 4445, 2001.
Japanese Office Action (JP Appln. No. 2009513244) dated Sep. 24, 2012 (and translation provided by foreign counsel).
Illuminating Engineering Institute of Japan, Popularization Section, New Illumination Class: Basic Knowledge of Illumination for Intermediate-Level Class, Japan, Illuminating Engineering Institute of Japan, Popularization Section, Feb. 19, 1995, pp. 53 and 54.
Korean Office Action (and translation provided by foreign counsel) from a corresponding Korean patent application bearing a mailing date of Apr. 5, 2013, 8 pages.
Japanese Office Action mailed May 9, 2013 (and English Translation provided by foreign associate) from a corresponding Japanese Patent Application.
European Search Report mailed Jul. 9, 2013 from a corresponding European Patent Application.

\* cited by examiner

LIGHTING DEVICE AND METHOD OF LIGHTING

CROSS-REFERENCE TO RELATED APPLICATIONS

This application claims the benefit of U.S. Provisional Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman), the entirety of which is hereby incorporated by reference.

FIELD OF THE INVENTION

The present invention is directed to a lighting device, in particular, a lighting device which includes at least one solid state light emitter which provides excellent efficacy. The present invention is also directed to a method of lighting which provides excellent efficacy, in particular a method of lighting which includes supplying current to a solid state light emitter.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient as compared to solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurement of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (lm/W), and/or duration of service.

A variety of solid state light emitters are well-known. For example, one type of solid state light emitter is a light emitting diode.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

Because light that is perceived as white is necessarily a blend of light of two or more colors (or wavelengths), no single light emitting diode junction has been developed that can produce white light. "White" LED lamps have been produced which have a light emitting diode pixel/cluster formed of respective red, green and blue light emitting diodes. Another "white" LED lamp which has been produced includes (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In addition, the blending of primary colors to produce combinations of non-primary colors is generally well understood in this and other arts. In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

The CRI Ra of efficient white LED lamps is generally low (in the range 65-75) as compared to incandescent light sources (CRI Ra of 100). Additionally the color temperature for LEDs is generally "cooler" (~5500K) and less desirable than the color temperature of incandescent or CCFL bulbs (~2700K). Both of these deficiencies in LEDs can be improved by the addition of other LEDs or lumiphors of selected saturated colors. As indicated above, light sources according to the present invention can utilize specific color "blending" of light sources of specific (x,y) color chromaticity coordinates (see U.S. Patent Application No. 60/752,555, filed Dec. 21, 2005, entitled "Lighting Device and Lighting Method" (inventors: Antony Paul van de Ven and Gerald H. Negley), the entirety of which is hereby incorporated by reference). For example, light from additional selected saturated sources can be mixed with the unsaturated broad spectrum source(s) to provide uniform illumination without any areas of discoloration; and if desired, for cosmetic reasons, the individual light emitters can be made to be not visible as discreet devices or discreet color areas when the illumination source or aperture is viewed directly.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (lm/W), and/or duration of service, are not limited to any particular color or color blends of light.

Aspects related to the present invention can be represented on either the 1931 CIE (Commission International de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows an enlarged portion of the 1976 Chromaticity Diagram, in order to show the blackbody locus in more detail. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=A \lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Also depicted on the 1976 CIE Diagram are designations A, B, C, D and E, which refer to light produced by several standard illuminants correspondingly identified as illuminants A, B, C, D and E, respectively.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or substantially transparent encapsulant material (e.g., epoxy-based, silicone-based, glass-based or metal oxide-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lights" (i.e., lights which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a peak wavelength of about 450 nm, and the phosphor produces yellow fluorescence with a peak wavelength of about 550 nm on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light. Another type uses a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

As also noted above, in another type of LED lamp, a light emitting diode chip that emits an ultraviolet ray is combined with phosphor materials that produce red (R), green (G) and blue (B) light rays. In such an LED lamp, the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

In substituting light emitting diodes for other light sources, e.g., incandescent light bulbs, packaged LEDs have been used with conventional light fixtures, for example, fixtures which include a hollow lens and a base plate attached to the lens, the base plate having a conventional socket housing with one or more contacts which is electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There exist "white" LED light sources which are relatively efficient but which have poor color rendering, typically having CRI Ra values of less than 75, and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight. Typically, such white LED lamps have a color temperature of approximately 5000K, which is generally not visually comfortable for general illumination, which may, however, be desirable for the illumination of commercial produce or advertising and printed materials.

Colored objects illuminated by RGB LED lamps sometimes do not appear in their true colors. For example, an object that reflects only yellow light, and thus that appears to be yellow when illuminated with white light, may appear desaturated and grayish when illuminated with light having an apparent yellow color, produced by the red and green LEDs of an RGB LED fixture. Such lamps, therefore, are considered not to provide excellent color rendition, particularly when illuminating various settings such as in general illumination, and particularly with regard to natural sources. In addition, currently available green LEDs are relatively inefficient, and thus limit the efficiency of such lamps.

Some so-called "warm white" LEDs have a more acceptable color temperature (typically 2700 to 3500 K) for indoor use, and in some cases, many (but not all) of such warm white LEDs have good CRI Ra (in the case of a yellow and red phosphor mix, as high as Ra=95), but their efficacy is generally significantly less than that of the standard "cool white" LEDs.

Employing LEDs having a wide variety of hues would similarly necessitate use of LEDs having a variety of efficiencies, including some with low efficiency, thereby reducing the efficiency of such systems and dramatically increase the complexity and cost of the circuitry to control the many different types of LEDs and maintain the color balance of the light.

There is therefore a need for a high efficiency solid-state white light source that combines the efficiency and long life of white LED lamps with an acceptable color temperature and good color rendering index, good contrast, a wide gamut and simple control circuitry.

In the case of conventional LED packages which include a phosphor, a significant proportion (e.g., in many cases, as much as 20% to 25%) of the excitation light (i.e., light from the LED) is reflected (back-scattered) from the phosphor back into the light emitting diode chip/package. Back-scattered light which is scattered back into the light emitting diode chip itself has a very low probability of coming out of the chip, and hence, such back-scattering results in a system loss of energy.

In addition, the phosphor converted light is omnidirectional, so that in general, 50% of the light is directed back to the LED source.

Furthermore, if the luminescent element is too thick, and/or if the luminescent material (e.g., phosphor) content in the luminescent element is too great, "self-absorption" may occur. Self-absorption occurs when light emissions within the packaging layer stay within the packaging layer to excite other phosphor particles and eventually are absorbed or are otherwise prevented from exiting the device, thus reducing performance (intensity) and efficiency. Additionally, if the particle size of the luminescent material (e.g., phosphors) is too large, the particles of luminescent material can cause unwanted scattering of both the excitation source (the LED chip) and the light generated by the phosphor.

There is an ongoing need for ways to use light emitting diodes in a wider variety of applications, with greater energy efficiency, with improved color rendering index (CRI Ra), with improved efficacy (lm/W), lower cost, and/or with longer duration of service.

BRIEF SUMMARY OF THE INVENTION

In a first aspect of the present invention, there is provided a lighting device comprising at least one solid state light emitter which, when supplied with electricity of a first wattage, emits output light of a brightness of at least 60 lumens per watt of the electricity.

In some embodiments according to the first aspect of the present invention, the output light is of a brightness of at least 300 lumens.

In some embodiments according to the first aspect of the present invention, the output light has a CRI Ra of at least 90.

In some embodiments according to the first aspect of the present invention, the lighting device, when supplied with electricity of a first wattage, emits output light of a brightness of at least 70 lumens per watt of the electricity.

In some embodiments according to the first aspect of the present invention, the lighting device, when supplied with electricity of a first wattage, emits output light of a brightness of at least 80 lumens/watt (in some cases, >85 lumens/watt) of the electricity.

In some embodiments according to the first aspect of the present invention, the solid state light emitter is a first light emitting diode.

In some embodiments according to the first aspect of the present invention, the lighting device comprises a plurality of light emitting diodes, including the first light emitting diode.

In some embodiments according to the first aspect of the present invention, the lighting device further comprises one or more lumiphors.

In some embodiments according to the first aspect of the present invention, the lighting device further comprises at least one power line, and at least a first group of light emitting diodes are directly or switchably electrically connected to the power line, a voltage drop across the first group of the light emitting diodes, and across any other components along that power line, being between 1.3 and 1.5 times (e.g., between 1.410 and 1.420 times) a standard outlet voltage (e.g., a standard outlet voltage of 110 volts AC).

In some embodiments according to the first aspect of the present invention, the light emitting diodes in the first group of light emitting diodes are arranged in series along the power line.

In a second aspect of the present invention, there is provided an enclosure, comprising an enclosed space and at least one lighting device according to the present invention, wherein if the lighting device is illuminated, the lighting device would illuminate at least a portion of the enclosure.

In a third aspect of the present invention, there is provided a lighting element, comprising a surface and at least one lighting device according to the present invention, wherein if the lighting device is illuminated, the lighting device would illuminate at least a portion of the surface.

In a fourth aspect of the present invention, there is provided a method of lighting, comprising supplying a lighting device with electricity of a first wattage, the lighting device emitting output light of an efficacy of at least 60 lumens per watt of the electricity.

In some embodiments according to the fourth aspect of the present invention, the output light is of a brightness of at least 300 lumens.

In some embodiments according to the fourth aspect of the present invention, the output light is perceived as white.

In some embodiments according to the fourth aspect of the present invention, the output light is perceived as non-white.

In some embodiments according to the fourth aspect of the present invention, the output light has a CRI Ra of at least 90.

In some embodiments according to the fourth aspect of the present invention, the lighting device, when supplied with electricity of a first wattage, emits output light of a brightness of at least 70 lumens per watt of the electricity.

In some embodiments according to the fourth aspect of the present invention, the lighting device, when supplied with electricity of a first wattage, emits output light of a brightness of at least 80 lumens/watt (in some cases, ≥85 lumens/watt) of the electricity.

In some embodiments according to the fourth aspect of the present invention, the solid state light emitter is a first light emitting diode. In some such embodiments, the lighting device comprises a plurality of light emitting diodes, including the first light emitting diode.

In some embodiments according to the fourth aspect of the present invention, the lighting device further comprises one or more lumiphors. In some such embodiments, each of the lumiphors is positioned within about 750 micrometers of at least one of the light emitting diodes.

In some embodiments according to the fourth aspect of the present invention, the lighting device further comprises at least one power line, and at least a first group of light emitting diodes are directly or switchably electrically connected to the power line, a voltage drop across the first group of the light emitting diodes, and across any other components along that power line, being between 1.3 and 1.5 times (e.g., between 1.410 and 1.420 times) a standard outlet voltage (e.g., a standard outlet voltage of 110 volts AC). In some such embodiments, the light emitting diodes in the first group of light emitting diodes are arranged in series along the power line.

The invention may be more fully understood with reference to the accompanying drawings and the following detailed description of the invention.

BRIEF DESCRIPTION OF THE DRAWING FIGURES

DETAILED DESCRIPTION OF THE INVENTION

Figure 1:
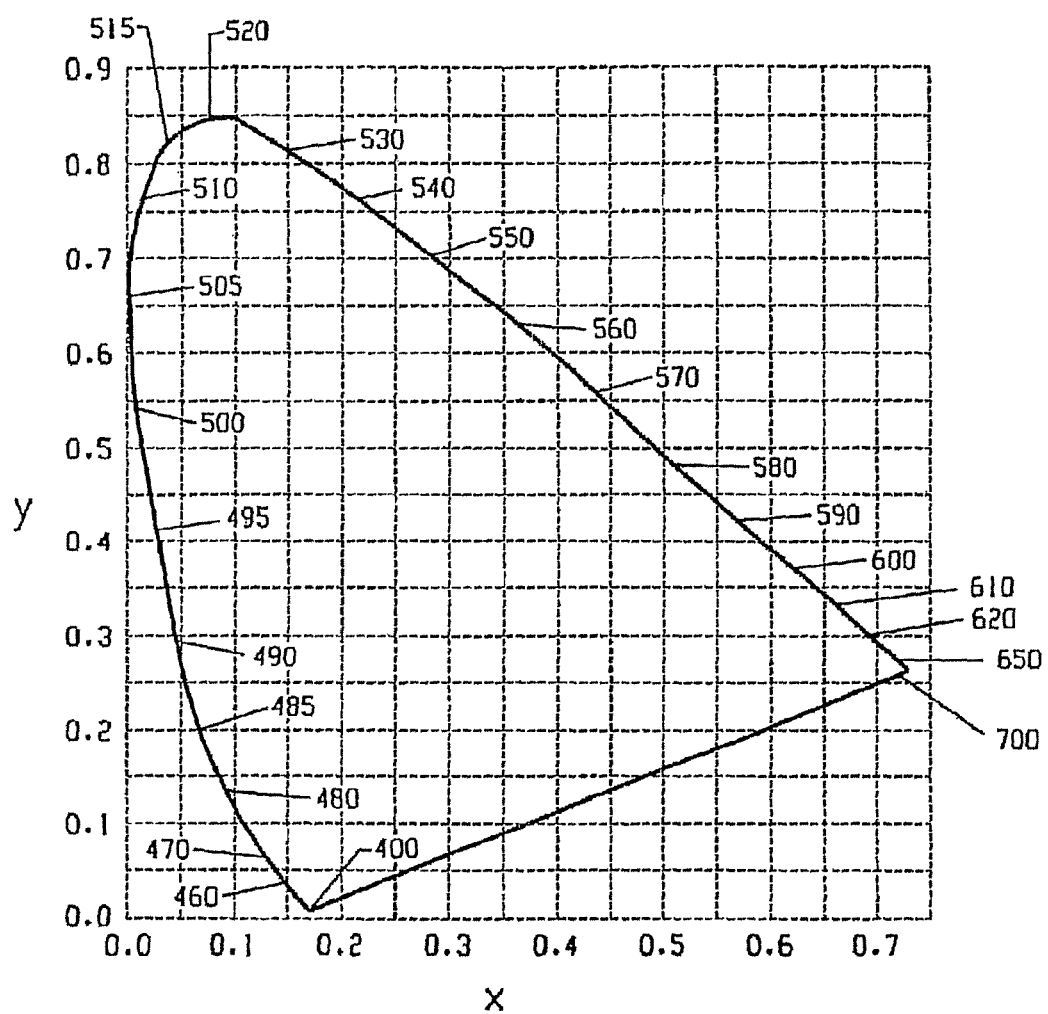
FIG. 1 shows the 1931 CIE Chromaticity Diagram.
Figure 2:
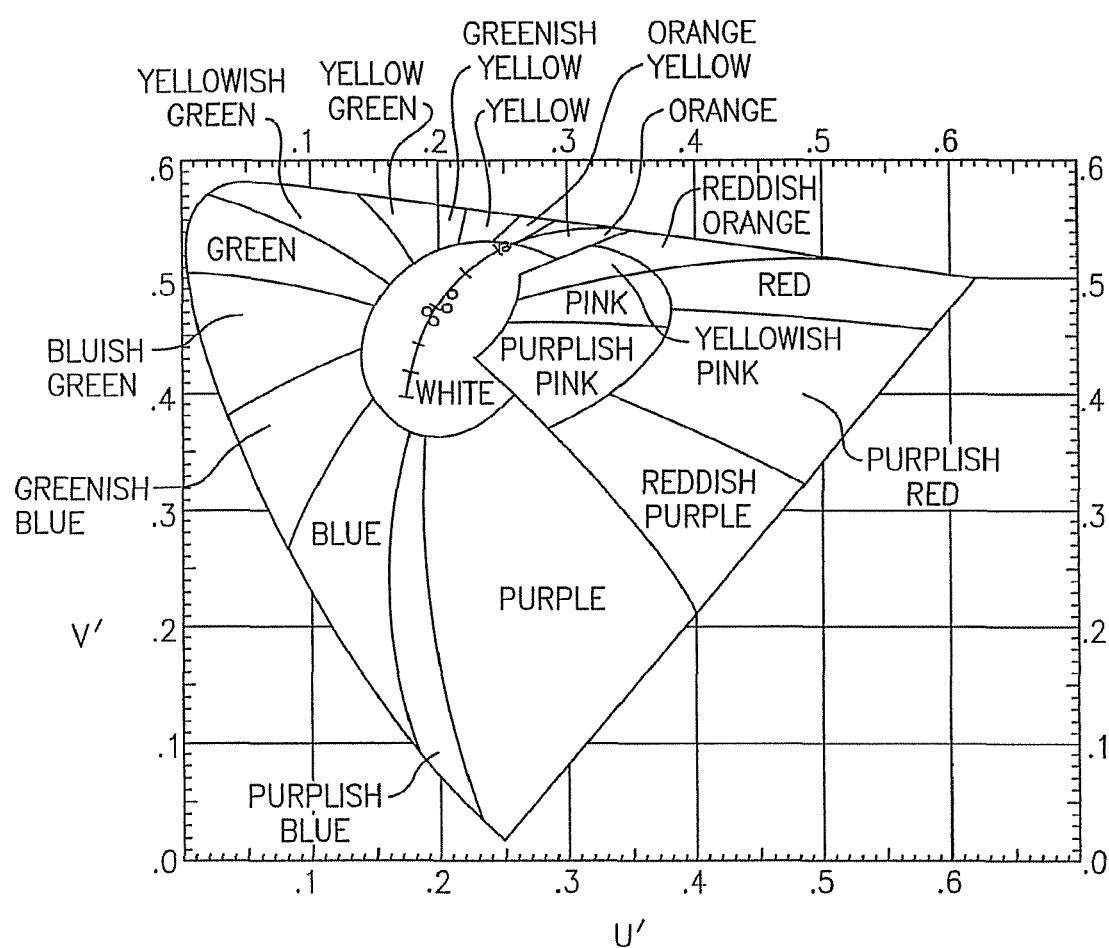
FIG. 2 shows the 1976 Chromaticity Diagram.
Figure 3:
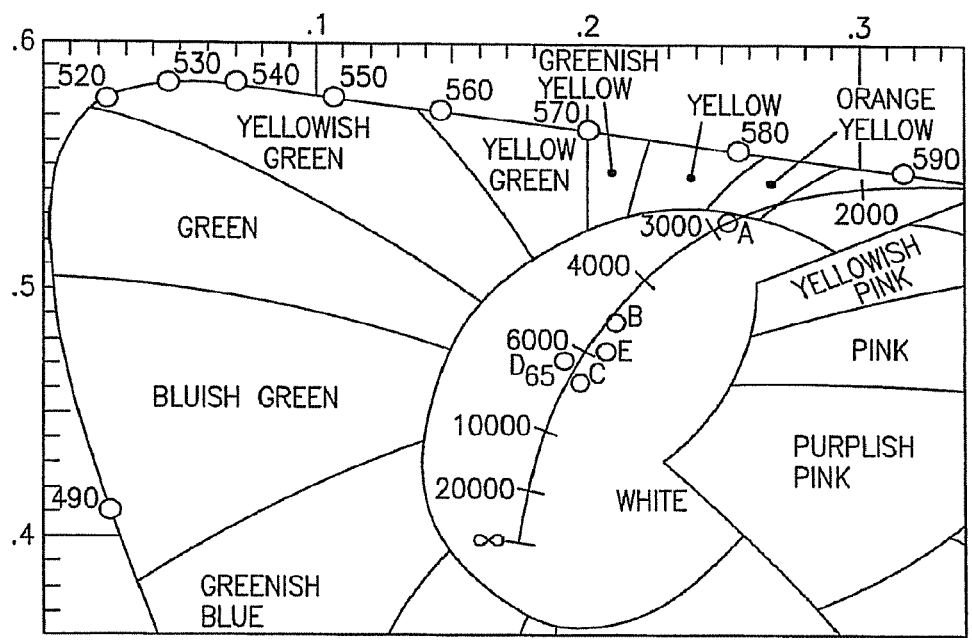
FIG. 3 shows an enlarged portion of the 1976 Chromaticity Diagram, in order to show the blackbody locus in detail.

As noted above, in a first aspect of the present invention, there is provided a lighting device comprising at least one solid state light emitter which, when supplied with electricity of a first wattage, emits output light of a brightness of at least 60 lumens per watt of the electricity. In some embodiments of the first aspect of the present invention, the output light is warm white.

Efficacy (in lumens per watt), as referred to herein, means brightness as measured relative to outlet energy, i.e., it is a measure of wall plug efficiency (as opposed to values sometimes given on individual components and/or assemblies of components). That is, "efficacy", as used herein, means lumens obtained from power input to the lighting device (not, e.g., lumens obtained from power input to an LED), i.e., efficacy is determined based on the total power consumed in running the lighting device, as opposed to merely the power consumed within one or more components such as individual LEDs.

The expression "illuminated", as used herein when referring to a light emitting diode, means that at least some current is being supplied to the light emitting diode to cause the light emitting diode to emit at least some light. The expression "illuminated" encompasses situations where the light emitting diode emits light continuously or intermittently at a rate such that a human eye would perceive it as emitting light continuously, or where a plurality of light emitting diodes of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

As used herein, the term "substantially" means at least about 90% correspondence with the feature recited. For example, the expression "substantially transparent", as used herein, means that the structure which is characterized as being substantially transparent allows passage of at least 90% of the light having a wavelength within the range of concern. The expression "substantially evenly" means that the spacing between any two items differs by not more than 10% from the average spacing between adjacent pairs of such items.

Any desired solid state light emitter or emitters can be employed in accordance with the present invention. Persons of skill in the art are aware of, and have ready access to, a wide variety of such emitters. Such solid state light emitters include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), a variety of each of which are well-known in the art (and therefore it is not necessary to describe in detail such devices, and/or the materials out of which such devices are made).

The respective light emitters can be similar to one another, different from one another or any combination (i.e., there can be a plurality of solid state light emitters of one type, or one or more solid state light emitters of each of two or more types)

As noted above, one type of solid state light emitter which can be employed are LEDs. Such LEDs can be selected from among any light emitting diodes (a wide variety of which are readily obtainable and well known to those skilled in the art, and therefore it is not necessary to describe in detail such devices, and/or the materials out of which such devices are made). For instance, examples of types of light emitting diodes include inorganic and organic light emitting diodes, a variety of each of which are well-known in the art.

Representative examples of such LEDs, many of which are known in the art, can include lead frames, lumiphors, encapsulant regions, etc.

Representative examples of suitable LEDs are described in:

(1) U.S. Patent Application No. 60/753,138, filed on Dec. 22, 2005, entitled "Lighting Device" (inventor: Gerald H. Negley), the entirety of which is hereby incorporated by reference;

(2) U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven), the entirety of which is hereby incorporated by reference;

(3) U.S. Patent Application No. 60/808,702, filed on May 26, 2006, entitled "Lighting Device" (inventors: Gerald H. Negley and Antony Paul van de Ven), the entirety of which is hereby incorporated by reference;

(4) U.S. Patent Application No. 60/808,925, filed on May 26, 2006, entitled "Solid State Light Emitting Device and Method of Making Same" (inventors: Gerald H. Negley and Neal Hunter), the entirety of which is hereby incorporated by reference;

(5) U.S. Patent Application No. 60/802,697, filed on May 23, 2006, entitled "Lighting Device and Method of Making" (inventor: Gerald H. Negley), the entirety of which is hereby incorporated by reference;

(6) U.S. Patent Application No. 60/839,453, filed on Aug. 23, 2006, entitled "LIGHTING DEVICE AND LIGHTING METHOD" (inventors: Antony Paul van de Ven and Gerald H. Negley), the entirety of which is hereby incorporated by reference;

(7) U.S. Patent Application No. 60/857,305, filed on Nov. 7, 2006, entitled "LIGHTING DEVICE AND LIGHTING METHOD" (inventors: Antony Paul van de Ven and Gerald H. Negley, the entirety of which is hereby incorporated by reference; and (8) U.S. Patent Application No. 60/851,230, filed on Oct. 12, 2006, entitled "LIGHTING DEVICE AND METHOD OF MAKING SAME" (inventor: Gerald H. Negley, the entirety of which is hereby incorporated by reference.

The lighting devices according to the present invention can comprise any desired number of solid state emitters.

As noted above, in some embodiments according to the first aspect of the present invention, the lighting device further comprises one or more lumiphors.

As noted above, in some embodiments according to the present invention, the lighting device further comprises at least one lumiphor (i.e., luminescence region or luminescent element which comprises at least one luminescent material). The expression "lumiphor", as used herein, refers to any luminescent element, i.e., any element which includes a luminescent material.

The one or more lumiphor's, when provided, can individually be any lumiphor, a wide variety of which are known to those skilled in the art. For example, the one or more luminescent materials in the lumiphor can be selected from among phosphors, scintillators, day glow tapes, inks which glow in the visible spectrum upon illumination with ultraviolet light, etc. The one or more luminescent materials can be down-converting or up-converting, or can include a combination of both types. For example, the first lumiphor can comprise one or more down-converting luminescent materials.

The or each of the one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide, or any other suitable material (for example, in any given lumiphor comprising one or more binder, one or more phosphor can be dispersed within the one or more binder). In general, the thicker the lumiphor, the lower the weight percentage of the phosphor can be. Representative examples of the weight percentage of phosphor include from about 3.3 weight percent up to about 20 weight percent, although, as indicated above, depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure).

Devices in which a lumiphor is provided can, if desired, further comprise one or more clear encapsulant (comprising, e.g., one or more silicone materials) positioned between the solid state light emitter (e.g., light emitting diode) and the lumiphor.

The or each of the one or more lumiphors can, independently, further comprise any of a number of well-known additives, e.g., diffusers, scatterers, tints, etc.

As noted above, in some embodiments according to the first aspect of the present invention, the lighting device further comprises at least one power line, and at least a first group of light emitting diodes are directly or switchably electrically connected to the power line, a voltage drop across the first group of the light emitting diodes, and across any other components along that power line, being between about 1.2 and 1.6 times, for example between 1.3 and 1.5 times (e.g., between 1.410 and 1.420 times) a standard outlet voltage (e.g., a standard outlet voltage of 110 volts AC).

For example, where the voltage from an outlet is 110 volts AC, and a power line connects to a plurality of blue light emitting diodes and a current regulator, in series, if the current regulator has a voltage drop of 7.6 volts and each light emitting diode has a voltage drop of 2.9 volts, a suitable number of such light emitting diodes to be included on that line would be 51.

Similarly, where the voltage from an outlet is 110 volts AC, and a power line connects to a plurality of blue light emitting diodes, a plurality of red light emitting diodes and a current regulator, in series, if the current regulator has a voltage drop of 7.6 volts, each blue light emitting diode has a voltage drop of 2.9 volts, and each red light emitting diode has a voltage drop of 2.0 volts, and the ratio of blue light emitting diodes to the sum of blue light emitting diodes and red light emitting diodes is desired to be in the range of from about 0.4 to about 0.6, suitable numbers of the respective light emitting diodes to be included on that line would include 24 blue and 47 red.

In addition, one or more scattering elements (e.g., layers) can optionally be included in the lighting devices according to this aspect of the present invention. The scattering element can be included in a lumiphor, and/or a separate scattering element can be provided. A wide variety of separate scattering elements and combined luminescent and scattering elements are well known to those of skill in the art, and any such elements can be employed in the lighting devices of the present invention.

In some embodiments according to the present invention, one or more of the light emitting diodes can be included in a package together with one or more of the lumiphors, and the one or more lumiphor in the package can be spaced from the one or more light emitting diode in the package to achieve improved light extraction efficiency, as described in U.S. Patent Application No. 60/753,138, filed on Dec. 22, 2005, entitled "Lighting Device" (inventor: Gerald H. Negley), the entirety of which is hereby incorporated by reference.

In some embodiments according to the present invention, two or more lumiphors can be provided, two or more of the lumiphors being spaced from each other, as described in U.S. Patent Application No. 60/761,310, filed on Jan. 23, 2006, entitled "Shifting Spectral Content in LEDs by Spatially Separating Lumiphor Films" (inventors: Gerald H. Negley and Antony Paul Van de Ven), the entirety of which is hereby incorporated by reference.

Solid state light emitters and any lumiphors can be selected so as to produce any desired mixtures of light.

Representative examples of suitable combinations of such components to provide desired light mixing are described in:

(1) U.S. Patent Application No. 60/752,555, filed Dec. 21, 2005, entitled "Lighting Device and Lighting Method" (inventors: Antony Paul van de Ven and Gerald H. Negley), the entirety of which is hereby incorporated by reference);

(2) U.S. Patent Application No. 60/752,556, filed Dec. 21, 2005, entitled "Lighting Device and Lighting Method" (inventors: Antony Paul van de Ven and Gerald H. Negley), the entirety of which is hereby incorporated by reference);

(3) U.S. Patent Application No. 60/793,524, filed Apr. 20, 2006, entitled "Lighting Device and Lighting Method" (inventors: Antony Paul van de Ven and Gerald H. Negley), the entirety of which is hereby incorporated by reference);

(4) U.S. Patent Application No. 60/793,518, filed Apr. 20, 2006, entitled "Lighting Device and Lighting Method" (inventors: Antony Paul van de Ven and Gerald H. Negley), the entirety of which is hereby incorporated by reference);

(5) U.S. Patent Application No. 60/793,530, filed Apr. 20, 2006, entitled "Lighting Device and Lighting Method" (inventors: Antony Paul van de Ven and Gerald H. Negley), the entirety of which is hereby incorporated by reference);

(6) U.S. patent application Ser. No. 11/566,440, filed on Dec. 4, 2006 (now U.S. Pat. No. 7,213,940), entitled "LIGHTING DEVICE AND LIGHTING METHOD" (inventors: Antony Paul van de Ven and Gerald H. Negley), the entirety of which is hereby incorporated by reference;

(7) U.S. Patent Application No. 60/868,986, filed on Dec. 7, 2006, entitled "LIGHTING DEVICE AND LIGHTING METHOD" (inventors: Antony Paul van de Ven and Gerald H. Negley), the entirety of which is hereby incorporated by reference;

(8) U.S. Patent Application No. 60/857,305, filed on Nov. 7, 2006, entitled "LIGHTING DEVICE AND LIGHTING METHOD" (inventors: Antony Paul van de Ven and Gerald H. Negley, the entirety of which is hereby incorporated by reference; and (9) U.S. Patent Application No. 60/891,148, filed on Feb. 22, 2007, entitled "LIGHTING DEVICE AND METHODS OF LIGHTING, LIGHT FILTERS AND METHODS OF FILTERING LIGHT" (inventor: Antony Paul van de Ven, the entirety of which is hereby incorporated by reference.

The expression "perceived as white", as used herein, means that normal human vision would perceive the light (i.e., the light which is characterized as being "perceived as white") as white.

Similarly, the expression "perceived as non-white", as used herein, means that normal human vision would perceive the light (i.e., the light which is characterized as being "perceived as white") as not being white (including, e.g., off-white and colors other than white).

The lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

Representative examples of arrangements of lighting devices, schemes for mounting lighting devices, apparatus for supplying electricity to lighting devices, housings for lighting devices, fixtures for lighting devices and power supplies for lighting devices, all of which are suitable for the lighting devices of the present invention, are described in:

(1) U.S. Patent Application No. 60/752,753, filed on Dec. 21, 2005, entitled "Lighting Device" (inventors: Gerald H. Negley, Antony Paul Van de Ven and Neal Hunter), the entirety of which is hereby incorporated by reference;

(2) U.S. Patent Application No. 60/798,446, filed on May 5, 2006, entitled "Lighting Device" (inventor: Antony Paul Van de Ven), the entirety of which is hereby incorporated by reference;

(3) U.S. Patent Application No. 60/761,879, filed on Jan. 25, 2006, entitled "Lighting Device With Cooling" (inventors: Thomas Coleman, Gerald H. Negley and Antony Paul Van de Ven), the entirety of which is hereby incorporated by reference;

(4) U.S. Patent Application No. 60/809,461, filed on May 31, 2006, entitled "Lighting Device With Color Control, and Method of Lighting" (inventor: Antony Paul van de Ven), the entirety of which is hereby incorporated by reference;

(5) U.S. Patent Application No. 60/809,595, filed on May 31, 2006, entitled "Lighting Device and Method of Lighting" (inventor: Gerald H. Negley), the entirety of which is hereby incorporated by reference;

(6) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), the entirety of which is hereby incorporated by reference; and (7) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), the entirety of which is hereby incorporated by reference.

The expression "lighting device" as used herein is not limited, except that it is capable of emitting light. That is, a lighting device can be a device which illuminates an area or volume (e.g., a room, a swimming pool, a warehouse, an indicator, a road, a vehicle, a road sign, a billboard, a ship, a boat, an aircraft, a stadium, a tree, a window, a yard, etc.), an indicator light, or a device or array of devices that illuminate an enclosure, or a device that is used for edge or back-lighting (e.g., back light poster, signage, LCD displays), or any other light emitting device.

The present invention further relates to an illuminated enclosure (the volume of which can be illuminated uniformly or non-uniformly), comprising an enclosed space and at least one lighting device according to the present invention, wherein the lighting device illuminates at least a portion of the enclosure (uniformly or non-uniformly).

The present invention further relates to an illuminated surface, comprising a surface and at least one lighting device according to the present invention, wherein the lighting device illuminates at least a portion of the surface.

The present invention further relates to an illuminated area, comprising at least one area selected from among the group consisting of a swimming pool, a room, a warehouse, an indicator, a road, a vehicle, a road sign, a billboard, a ship, a boat, an aircraft, a stadium, a tree, a window, and a lamppost having mounted therein or thereon at least one lighting device according to the present invention.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

In some embodiments according to the present invention, any of the features, e.g., circuitry, as described in U.S. Patent Application No. 60/761,879, filed on Jan. 25, 2006, entitled "Lighting Device With Cooling" (inventors: Thomas Coleman, Gerald H. Negley and Antony Paul Van de Ven), the entirety of which is hereby incorporated by reference, can be employed.

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

Figure 4:
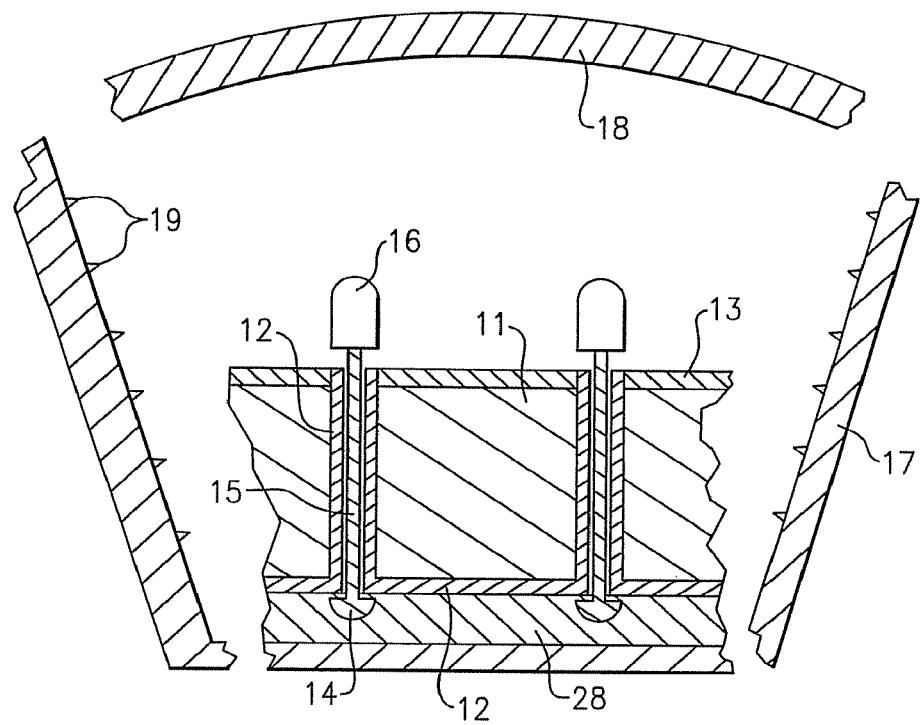
FIG. 4 depicts a first embodiment of a lighting device according to the present invention.

FIG. 4 depicts a first embodiment of a lighting device in accordance with the first aspect of the present invention.

Referring to FIG. 4, there is shown a lighting device which includes a heat spreading element 11 (formed of aluminum), insulating regions 12 (formed in situ by anodizing surfaces of the aluminum heat spreading element), a highly reflective surface 13 (formed in situ by polishing the surface of the aluminum heat spreading element), conductive traces 14 formed of copper, lead frames 15 formed of silver-plated copper (or silver-plated mild steel), packaged LEDs 16a, 16b (described in more detail below), a reflective cone 17 (made of MCPET® (marketed by Furukawa, a Japanese corporation) with a diffuse light scattering surface and a diffusing element 18 (the diffusing element 18 performs a light scattering function).

The thickness of the heat spreading element 11 is about 10 mm.

The reflective cone 17 is about 1 mm thick.

The diffusing element 18 is about 0.2 mm thick and is made of glass (or plastic).

The device depicted in FIG. 4 further includes an insulating element 28 below the conductive traces 14. The insulating element 28 is about 250 micrometers thick and is made of T-preg™ by T-Lam™ (see www.ewh.ieee.org/soc/cpmt/presentations/cpmt0412.pdf).

The device depicted in FIG. 4 includes three series strings of LED emitters.

Figure 6:
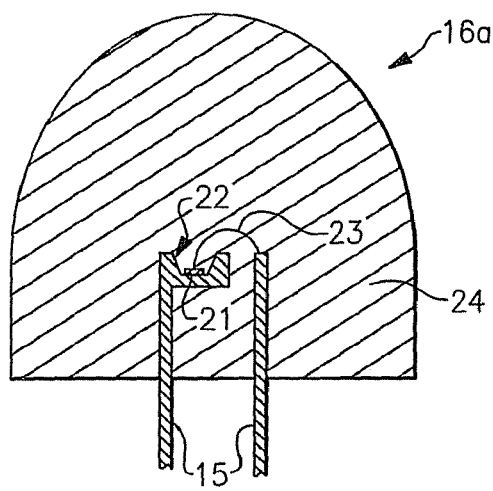
FIG. 6 is a cross-sectional view of one of the red LEDs 16a employed in the embodiment depicted in FIGS. 4 and 5.
Figure 7:
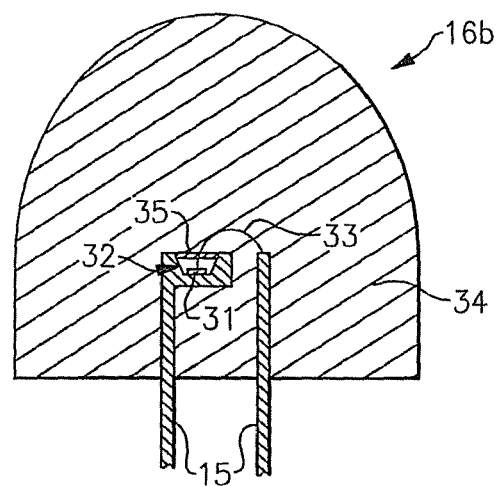
FIG. 7 is a cross-sectional view of one of the greenish-yellowish emitters 16b employed in the embodiment depicted in FIGS. 4 and 5.

Connected to the first string of LED emitters are a current regulator, forty-seven red LEDs 16a (shown in more detail in FIG. 6), and twenty-one greenish-yellowish emitters 16b (each including a blue LED and a broad spectrum emitting lumiphor) (shown in more detail in FIG. 7).

Connected to the second string of LED emitters are a current regulator, zero red LEDs and fifty-one greenish-yellowish emitters 16b (as above).

Connected to the third string of LED emitters are a current regulator, zero red LEDs and fifty-one greenish-yellowish emitters 16b (as above).

The voltage drop across each of the red LEDs 16a is about 2 volts.

The voltage drop across each of the blue LEDs is about 3 volts.

The voltage drop across each of the current regulators is about 7 volts.

The current passing through the first string of LED emitters is regulated to be about 20 milliamps.

The current passing through the second string of LED emitters is regulated to be about 20 milliamps.

The current passing through the third string of LED emitters is regulated to be about 20 milliamps.

The diffusing element 18 is located about two inches from the heat spreading element 11. The diffusing element 18 is attached to a top region of the reflective cone 17. The insulating element 28 is also attached to a bottom region of the reflective cone 17.

The heat spreading element 11 serves to spread out the heat, act as a heat sink, and dissipate the heat from the LEDs.

Likewise, the reflective cone 17 functions as a heat sink. In addition, the reflective cone 17 includes ridges 19 to enhance its reflective properties.

Figure 5:
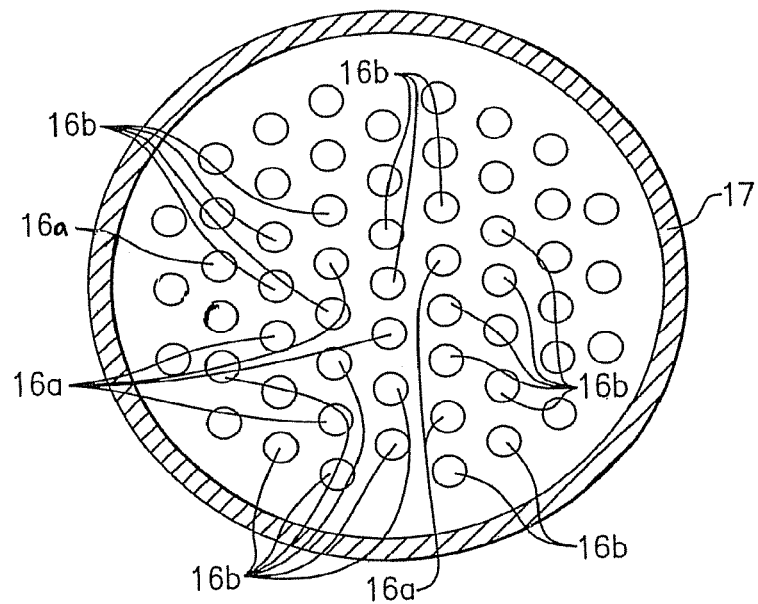
FIG. 5 is a sectional view taken along plane V-V shown in FIG. 4 (and is not drawn to the same scale as FIG. 4).

FIG. 5 is a sectional view taken along plane V-V shown in FIG. 4 (and is not drawn to the same scale as FIG. 4).

As shown in FIG. 5, each of the red LEDs 16a is surrounded by five or six greenish-yellowish emitters 16b, i.e., the red LEDs 16a and the greenish-yellowish emitters 16b are arranged in generally laterally arranged rows and spaced from one another substantially evenly, each row being laterally offset from the next adjacent (in a longitudinal direction) row by half the distance between laterally adjacent light emitting diodes, with, in most locations, two greenish-yellowish emitters 16b being located between each red LED 16a and its nearest red LED 16a neighbor in the same row, and with the red LEDs 16a in each row being offset from the nearest red LED(s) 16a in the next adjacent (in a longitudinal direction) row by one and a half times the distance between laterally spaced adjacent light emitting diodes. The spacing between each adjacent LED in each row is about 6 mm.

FIG. 6 is a cross-sectional view of one of the red LEDs 16a employed in the embodiment depicted in FIGS. 4 and 5.

Referring to FIG. 6, each of the red LEDs 16a includes a red light emitting diode chip 21 (from Epistar in Taiwan, measuring 14 mils×14 mils, comprising AlInGaP and having a brightness of not less than 600 mcd), a lead frame 15 having a reflective surface 22, a copper wire 23, and an encapsulant region 24. The reflective surface 22 is made of silver. The encapsulant region 24 is made of Hysol OS 4000. The red LEDs 16a are nearly saturated, i.e., they have a purity of at least 85%, the term "purity" having a well-known meaning to persons skilled in the art, and procedures for calculating purity being well-known to those of skill in the art. The red LEDs 16a emit light having a dominant wavelength in the range of from about 612 nm to about 625 nm.

FIG. 7 is a cross-sectional view of one of the greenish-yellowish emitters 16b employed in the embodiment depicted in FIGS. 4 and 5.

Referring to FIG. 7, each of the greenish-yellowish emitters 16b includes a blue light emitting diode chip 31 (namely, a Cree XT LED (C460XT290) die with a peak wavelength range of from about 450 nm to about 465 nm, and optical power greater than 24 mW), a lead frame 15 having a reflective surface 32, a copper wire 33, an encapsulant region 34, and a broad spectrum emitting lumiphor 35. The reflective surface 32 is made of silver. The encapsulant region 34 is made of Hysol OS400 or GE/Toshiba Invisil 5332. The lumiphor 35 comprises a luminescent material consisting of QMK58/F-U1 YAG:Ce by Phosphor Teck—UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles have particle sizes in the range of from about 1.6 micrometers to about 8.6 micrometers, with the mean particle size being in the range of from about 4 micrometers to about 5 micrometers. The lumiphor 35 is spaced from the chip 31 by a distance in the range of from about 100 micrometers to about 750 micrometers (for example, from about 500 micrometers to about 750 micrometers, e.g., about 750 micrometers). The blue chip 31 emits light having a peak wavelength in the range of from about 450 nm to about 465 nm.

The combined light exiting the lumiphor 35 (i.e., a mixture of light including blue light emitted by the blue chip 31 which passes through the lumiphor and light emitted by the luminescent material upon being excited by light emitted from the blue chip 31), corresponds to a point on the 1931 CIE Chromaticity Diagram having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, specific examples including a point having x, y color coordinates of 0.3706, 0.4370 for 2850 K light, and 0.3550, 0.4089 for 3400 K light.

Figure 8:
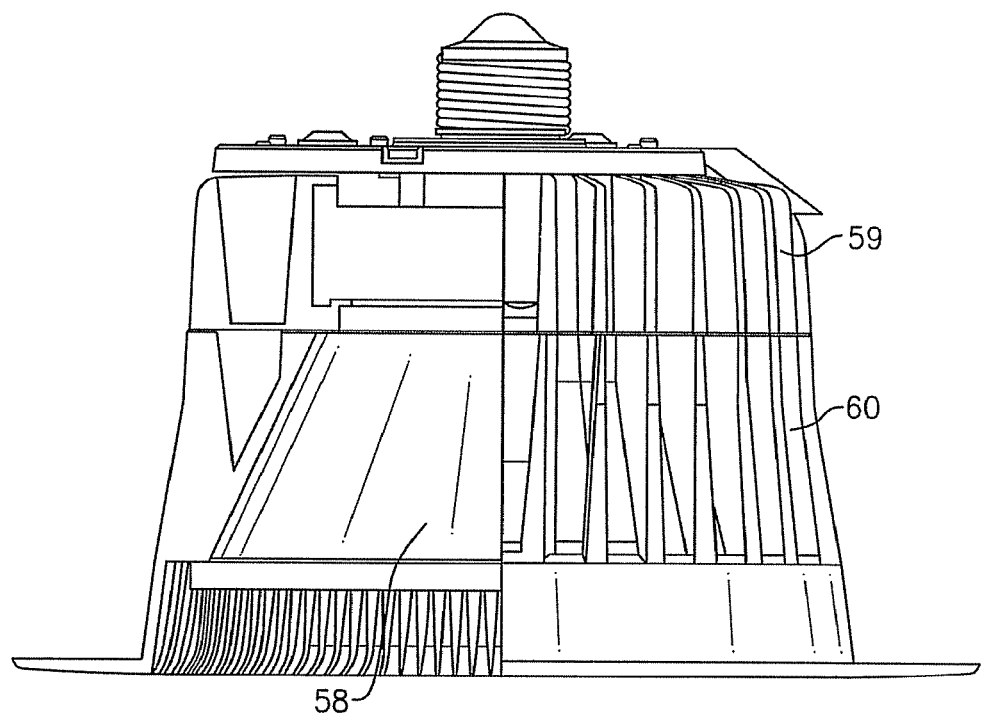
FIG. 8 is a partial cutaway view of a second embodiment of a lighting device according to the present invention.
Figure 9:
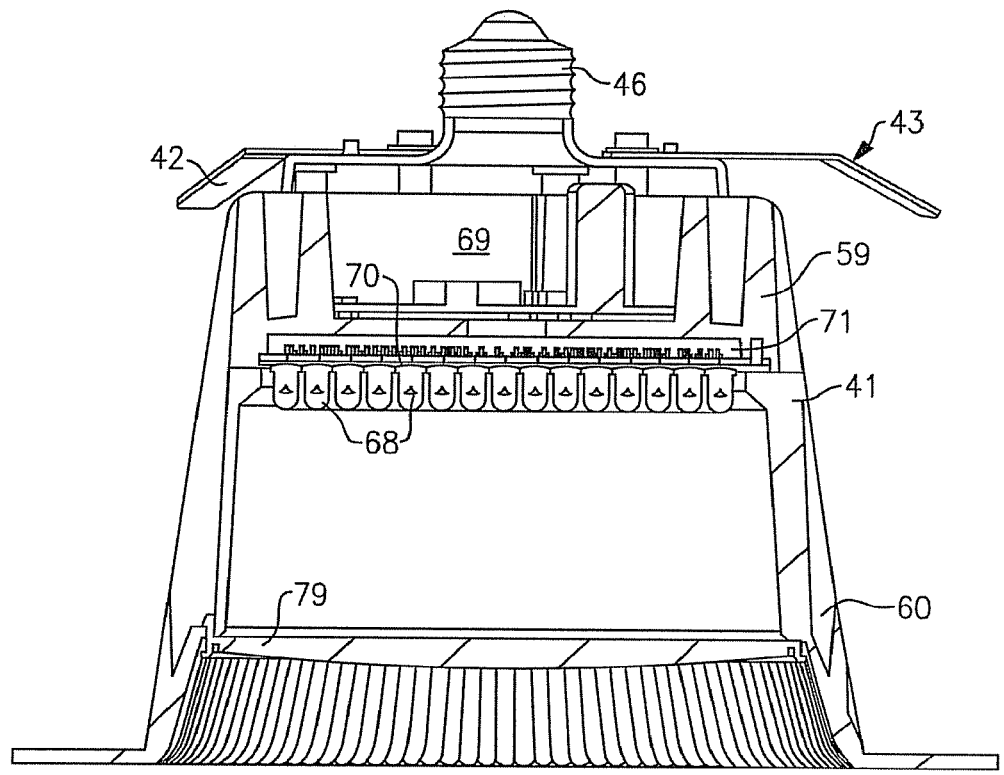
FIG. 9 is a sectional view of a lighting device according to the present invention.
Figure 10:
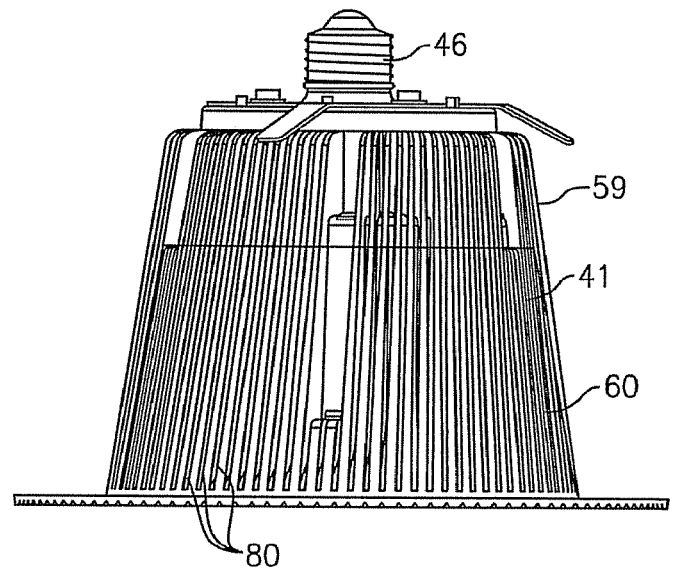
FIG. 10 is a front elevation view of the second embodiment.

FIGS. 8-11 depict a second embodiment of a lighting device in accordance with the present invention. FIG. 8 is a partial cutaway view of the lighting device of the second embodiment. FIG. 9 is a sectional view of the lighting device, in which the shape differs somewhat from the device depicted in FIG. 8, but the description below applies equally.

Referring to FIG. 9, the lighting device comprises a light engine housing 41. The device further comprises a first mounting clip 42, a second mounting clip 43 and a third mounting clip 44 (the clip 44 is not visible in FIG. 9).

The light engine housing 41 comprises a screw-threaded electrical connection region 46 which can be received in an Edison socket.

The light engine housing 41 comprises an upper housing 59 and a lower housing 60. The interior of the lower housing 60 comprises a reflective cone 58 (see FIG. 8) (facing inward) made of MCPET® (foamed sheets made of polyethylene terephthalate).

The device includes a light engine which comprises a plurality of LEDs 68, a ballast element 69, a circuit board 70 and a heat transfer region 71. The heat transfer region comprises epoxy with dispersed particles of SiC. Each of the LEDs 68 includes a pair of electrically conductive legs which extend through the circuit board 70 (and which are soldered to conductive regions on the circuit board 70) and into the heat transfer region 71.

A first region of the ballast element 69 is electrically connected to the electrical connection region 46, and a second region of the ballast element 69 is electrically connected to the light engine. The ballast element 69 comprises circuitry which, if power of a first voltage is supplied to the first region of the first ballast element, outputs power of a second voltage, and supplies the power of the second voltage to the light engine.

The lighting device also includes a light diffuser 79.

The exterior surface of the light engine housing has a plurality of fins 80 (most easily seen in FIG. 10) to assist in heat dissipation from the light engine housing.

The lighting device includes a plurality (e.g., three) series strings of LED emitters.

Connected to a first string of LED emitters are a current regulator and a plurality (e.g., six) of greenish-yellowish emitters. Each of the greenish-yellowish emitter includes a blue LED and a lumiphor, the lumiphor comprising YAG doped with Ce, Pr and/or Gd.

Connected to a second string of LED emitters are a current regulator, and a ratio of red LEDs to greenish-yellowish emitters, e.g., zero red LEDs and a plurality (e.g., six) of greenish-yellowish emitters.

Connected to a third string of LED emitters are a current regulator, and a different ratio of red LEDs to greenish-yellowish emitters, e.g., a plurality of red LEDs (e.g., thirty) and zero greenish-yellowish emitters.

The three strings are electrically connected to a common power line, whereby they are simultaneously driven. Using the current regulators on each string, the current supplied to each string can be adjusted.

Each of the LED emitters comprises an LED chip mounted on a reflective cup made of silver-plated copper. Each of the red LEDs emits light of substantially the same dominant wavelength.

At least some of the greenish-yellowish LEDs are each surrounded by red emitters.

Figure 11:
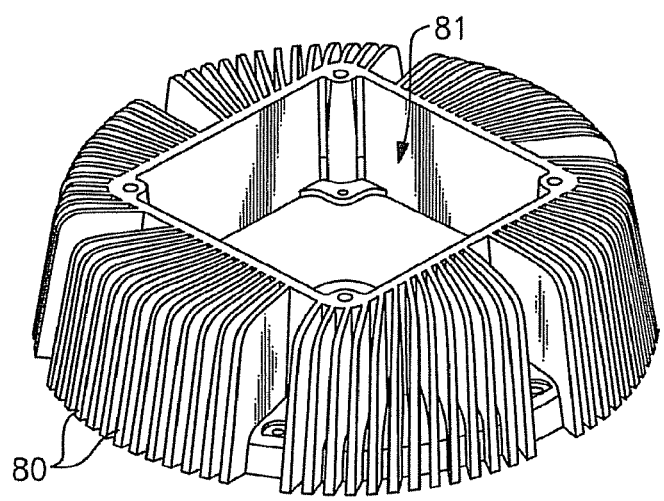
FIG. 11 is a perspective view of the upper housing of the second embodiment.

FIG. 11 is a perspective view of the upper housing, including a recess 81 in which the ballast element (not shown) is positioned.

Any two or more structural parts of the lighting devices described herein can be integrated. Any structural part of the lighting devices described herein can be provided in two or more parts (which are held together, if necessary). Similarly, any two or more functions can be conducted simultaneously, and/or any function can be conducted in a series of steps.

The invention claimed is:

1. A lighting device comprising at least one light emitting diode,
said lighting device, when supplied with electricity of a first wattage, emitting output light with a wall plug efficiency of at least 60 lumens per watt of said electricity.

2. A lighting device as recited in claim 1, wherein said output light is of a brightness of at least 300 lumens.

3. A lighting device as recited in claim 1, wherein said output light is of a brightness of at least 500 lumens.

4. A lighting device as recited in claim 1, wherein said output light is perceived as white.

5. A lighting device as recited in claim 1, wherein said output light is perceived as non-white.

6. A lighting device as recited in claim 1, wherein said output light has a CRI Ra of at least 90.

7. A lighting device as recited in claim 1, wherein said lighting device, when supplied with electricity of said first wattage, emits output light with a wall plug efficiency of at least 70 lumens per watt of said electricity.

8. A lighting device as recited in claim 7, wherein said output light is of a brightness of at least 300 lumens.

9. A lighting device as recited in claim 1, wherein said lighting device, when supplied with electricity of said first wattage, emits output light with a wall plug efficiency of at least 80 lumens per watt of said electricity.

10. A lighting device as recited in claim 9, wherein said output light is of a brightness of at least 300 lumens.

11. A lighting device as recited in claim 1, wherein said lighting device comprises a plurality of light emitting diodes.

12. A lighting device as recited in claim 11, wherein said lighting device further comprises a plurality of lumiphors.

13. A lighting device as recited in claim 12, wherein each of said lumiphors is positioned within about 750 micrometers of at least one of said light emitting diodes.

14. A lighting device as recited in claim 11, wherein said lighting device further comprises at least one power line, at least a first group of said light emitting diodes being directly or switchably electrically connected to said power line, a voltage drop across said first group of said light emitting diodes, and across any other components along said power line, being between 1.3 and 1.5 times a standard outlet voltage.

15. A lighting device as recited in claim 14, wherein said standard outlet voltage is 110 volts AC.

16. A lighting device as recited in claim 14, wherein said voltage drop across said first group of said light emitting diodes, and across any other components along said power line, is between 1.410 and 1.420 times said standard outlet voltage.

17. A lighting device as recited in claim 14, wherein said light emitting diodes in said first group of light emitting diodes are arranged in series along said power line.

18. A lighting device as recited in claim 14, wherein said first group of said light emitting diodes comprises a plurality of said light emitting diodes.

19. A lighting device as recited in claim 1, wherein said lighting device further comprises at least one lumiphor.

20. A lighting device as recited in claim 1, wherein when said lighting device is supplied with electricity of said first wattage, a mixture of all light exiting from said lighting device which was emitted by said at least one light emitting diode which emit light having a dominant wavelength which is outside the range of between 600 nm and 700 nm would have x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

21. A lighting device as recited in claim 1, wherein said lighting device further comprises at least one lumiphor, and when said lighting device is supplied with electricity of said first wattage, a mixture of all light exiting from said lighting device which was emitted by one of said at least one light emitting diode which emit light having a dominant wavelength which is outside the range of between 600 nm and 700 nm, and all light exiting from said lighting device which was emitted by one of said at least one lumiphor which emit light having a dominant wavelength which is outside the range of between 600 nm and 700 nm, would have x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

22. An enclosure, comprising an enclosed space and at least one lighting device as recited in claim 1, wherein when said lighting device is illuminated, said lighting device would illuminate at least a portion of said enclosure.

23. A lighting element, comprising a surface and at least one lighting device as recited in claim 1, wherein when said lighting device is illuminated, said lighting device would illuminate at least a portion of said surface.

24. A lighting device as recited in claim 1, wherein said output light is perceived as warm white.

25. A lighting device as recited in claim 1, wherein said lighting device, when supplied with electricity of a first wattage, emits output light having a wall plug efficiency in the range of from about 60 to about 70 lumens per watt of said electricity.

26. A lighting device as recited in claim 1, wherein said lighting device, when supplied with electricity of a first wattage, emits output light having a wall plug efficiency in the range of from about 70 to about 80 lumens per watt of said electricity.

27. A lighting device as recited in claim 1, wherein said lighting device, when supplied with electricity of a first wattage, emits output light having a wall plug efficiency in the range of from about 80 to about 85 lumens per watt of said electricity.

28. A lighting device as recited in claim 1, wherein said electricity is AC electricity.

29. A method of lighting, comprising supplying a lighting device with electricity of a first wattage, said lighting device comprising at least one light emitting diode, said lighting device emitting output light with a wall plug efficiency of at least 60 lumens per watt of said electricity.

30. A method as recited in claim 29, wherein said output light is of a brightness of at least 300 lumens.

31. A method as recited in claim 29, wherein said output light is of a brightness of at least 500 lumens.

32. A method as recited in claim 29, wherein said output light is perceived as white.

33. A method as recited in claim 29, wherein said output light is perceived as non-white.

34. A method as recited in claim 29, wherein said output light has a CRI Ra of at least 90.

35. A method as recited in claim 29, wherein said lighting device, when supplied with electricity of said first wattage, emits output light with a wall plug efficiency of at least 70 lumens per watt of said electricity.

36. A method as recited in claim 35, wherein said output light is of a brightness of at least 300 lumens.

37. A method as recited in claim 29, wherein said lighting device, when supplied with electricity of said first wattage, emits output light with a wall plug efficiency of at least 80 lumens per watt of said electricity.

38. A method as recited in claim 37, wherein said output light is of a brightness of at least 300 lumens.

39. A method as recited in claim 29, wherein said at least one light emitting diode comprises a first light emitting diode.

40. A method as recited in claim 39, wherein said lighting device comprises a plurality of light emitting diodes, including said first light emitting diode.

41. A method as recited in claim 40, wherein said lighting device further comprises a plurality of lumiphors.

42. A method as recited in claim 41, wherein each of said lumiphors is positioned within about 750 micrometers of at least one of said light emitting diodes.

43. A method as recited in claim 40, wherein said lighting device further comprises at least one power line, at least a first group of said light emitting diodes being directly or switchably electrically connected to said power line, a voltage drop across said first group of said light emitting diodes, and across any other components along said power line, being between 1.3 and 1.5 times a voltage of said electricity.

44. A method as recited in claim 43, wherein said voltage of said electricity is 110 volts AC.

45. A method as recited in claim 43, wherein said voltage drop across said first group of said light emitting diodes, and across any other components along said power line, is between 1.410 and 1.420 times said voltage of said electricity.

46. A method as recited in claim 43, wherein said first group of said light emitting diodes comprises a plurality of said light emitting diodes.

47. A method as recited in claim 29, wherein said lighting device further comprises at least one lumiphor.

48. A method as recited in claim 29, wherein said lighting device emits output light having a wall plug efficiency in the range of from about 60 to about 70 lumens per watt of said electricity.

49. A method as recited in claim 29, wherein said lighting device emits output light having a wall plug efficiency in the range of from about 70 to about 80 lumens per watt of said electricity.

50. A method as recited in claim 29, wherein said lighting device emits output light having a wall plug efficiency in the range of from about 80 to about 85 lumens per watt of said electricity.

51. A method as recited in claim 29, wherein said electricity is AC electricity.

52. A lighting device comprising at least a first light emitting diode, said lighting device, when supplied with AC electricity of a first wattage, emitting output light having a wall plug efficiency of at least 60 lumens per watt of said electricity, said output light being a quantity of light exiting from the lighting device, said output light being perceived as white light.

53. A lighting device as recited in claim 52, wherein said lighting device comprises a plurality of light emitting diodes, including said first light emitting diode.

54. A lighting device as recited in claim 52, wherein said output light is of a brightness of at least 300 lumens.

55. A lighting device as recited in claim 52, wherein said output light is of a brightness of at least 500 lumens.

56. A lighting device as recited in claim 52, wherein said output light has a CRI Ra of at least 90.

57. A method as recited in claim 52, wherein said lighting device emits output light having a wall plug efficiency in the range of from about 60 to about 70 lumens per watt of said electricity.

58. A method as recited in claim 52, wherein said lighting device emits output light having a wall plug efficiency in the range of from about 70 to about 80 lumens per watt of said electricity.

59. A method as recited in claim 52, wherein said lighting device emits output light having a wall plug efficiency in the range of from about 80 to about 85 lumens per watt of said electricity.

60. A method of lighting, comprising supplying a lighting device with AC electricity of a first wattage, said lighting device comprising at least a first light emitting diode, said lighting device emitting output light having a wall plug efficiency of at least 60 lumens per watt of said electricity, said output light being a quantity of light exiting from the lighting device, said output light being perceived as white light.

61. A lighting device as recited in claim 60, wherein said lighting device comprises a plurality of light emitting diodes, including said first light emitting diode.

62. A lighting device as recited in claim 60, wherein said output light is of a brightness of at least 300 lumens.

63. A lighting device as recited in claim 60, wherein said output light is of a brightness of at least 500 lumens.

64. A lighting device as recited in claim 60, wherein said output light has a CRI Ra of at least 90.

65. A method as recited in claim 60, wherein said lighting device emits output light having a wall plug efficiency in the range of from about 60 to about 70 lumens per watt of said electricity.

66. A method as recited in claim 60, wherein said lighting device emits output light having a wall plug efficiency in the range of from about 70 to about 80 lumens per watt of said electricity.

67. A method as recited in claim 60, wherein said lighting device emits output light having a wall plug efficiency in the range of from about 80 to about 85 lumens per watt of said electricity.

\* \* \* \* \*

UNITED STATES PATENT AND TRADEMARK OFFICE
CERTIFICATE OF CORRECTION

PATENT NO. : 8,596,819 B2  
APPLICATION NO. : 11/755153  
DATED : December 3, 2013  
INVENTOR(S) : Gerald H. Negley et al.

Page 1 of 1

It is certified that error appears in the above-identified patent and that said Letters Patent is hereby corrected as shown below:

On the Title Page, Item (56) References Cited, U.S. PATENT DOCUMENTS

Please add: "2007/0279440 A1 12/2007 Negley"

Please add: "2008/0084700 A1 4/2008 Van De Ven"

On the Title Page, Item (56) References Cited, OTHER DOCUMENTS

Please add: "COLOR KINETICS INC., Color Kinetics Support: White Papers & Presentations; available at http://www.colorkinetics.com/support/whitepapers/:, Solid State Lighting White Papers & Presentations, 2/22/2006, pp. 1-4"

Please add: "PERMLIGHT INC., *Enbryten LED Product Information*, February 2005, Publisher: Permlight Inc. website; accessed at http://www.webarchive.org displaying that www.permlight.com/products/LEDfixtures.asp was publicly available January 2004"

Title Page 4, Item (56) Column 2 OTHER PUBLICATIONS

Please Change: "DOE SSK CALiPer Report, "Product Test Reference: CALiPER 07-31 Downlight Lamp", (Sep. 2007)" to -- DOE SSL CALiPer Report, "Product Test Reference: CALiPER 07-31 Downlight Lamp", (Sep. 2007) --

Signed and Sealed this  
Thirteenth Day of May, 2014

Michelle K. Lee  
*Deputy Director of the United States Patent and Trademark Office*

UNITED STATES PATENT AND TRADEMARK OFFICE
CERTIFICATE OF CORRECTION

PATENT NO.         : 8,596,819 B2
APPLICATION NO.    : 11/755153
DATED              : December 3, 2013
INVENTOR(S)        : Gerald H. Negley et al.

It is certified that error appears in the above-identified patent and that said Letters Patent is hereby corrected as shown below:

In the Claims

Column 22, line 1, claim 57:

Please change "A method as recited" to -- A lighting device as recited --

Column 22, line 5, claim 58:

Please change "A method as recited" to -- A lighting device as recited --

Column 22, line 9, claim 56:

Please change "A method as recited" to -- A lighting device as recited --

Column 22, line 20, claim 61:

Please change "A lighting device as recited" to -- A method as recited --

Column 22, line 23, claim 62:

Please change "A lighting device as recited" to -- A method as recited --

Column 22, line 25, claim 64:

Please change "A lighting device as recited" to -- A method as recited --

Column 22, line 27, claim 65:

Please change "A lighting device as recited" to -- A method as recited --

Signed and Sealed this
Twenty-fourth Day of March, 2015

Michelle K. Lee
*Director of the United States Patent and Trademark Office*

UNITED STATES PATENT AND TRADEMARK OFFICE
CERTIFICATE OF CORRECTION

PATENT NO. : 8,596,819 B2  
APPLICATION NO. : 11/755153  
DATED : December 3, 2013  
INVENTOR(S) : Gerald H. Negley et al.

Page 1 of 2

It is certified that error appears in the above-identified patent and that said Letters Patent is hereby corrected as shown below:

In the Claims

Column 22, line 1, claim 57:

Please change "A method as recited" to -- A lighting device as recited --

Column 22, line 5, claim 58:

Please change "A method as recited" to -- A lighting device as recited --

Column 22, line 9, claim 59:

Please change "A method as recited" to -- A lighting device as recited --

Column 22, line 20, claim 61:

Please change "A lighting device as recited" to -- A method as recited --

Column 22, line 23, claim 62:

Please change "A lighting device as recited" to -- A method as recited --

Column 22, line 25, claim 63:

Please change "A lighting device as recited" to -- A method as recited --

This certificate supersedes the Certificate of Correction issued March 24, 2015.

Signed and Sealed this  
Twenty-eighth Day of April, 2015

Michelle K. Lee  
*Director of the United States Patent and Trademark Office*

CERTIFICATE OF CORRECTION (continued)
U.S. Pat. No. 8,596,819 B2

Column 22, line 27, claim 64:

Please change "A lighting device as recited" to -- A method as recited --